United States Patent
Pfeiffer et al.

(10) Patent No.: US 6,916,397 B2
(45) Date of Patent: Jul. 12, 2005

(54) METHODS AND APPARATUS FOR MAINTAINING A PRESSURE WITHIN AN ENVIRONMENTALLY CONTROLLED CHAMBER

(75) Inventors: Kenneth Pfeiffer, Austin, TX (US); Gregory S. Verdict, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 194 days.

(21) Appl. No.: 10/311,131

(22) PCT Filed: Jun. 13, 2001

(86) PCT No.: PCT/US01/18992
§ 371 (c)(1),
(2), (4) Date: Dec. 13, 2002

(87) PCT Pub. No.: WO01/96972
PCT Pub. Date: Dec. 20, 2001

(65) Prior Publication Data
US 2003/0209322 A1 Nov. 13, 2003

Related U.S. Application Data

(60) Provisional application No. 60/211,402, filed on Jun. 14, 2000.

(51) Int. Cl.[7] .......................... C23F 1/00; H01L 21/306; C23C 16/00
(52) U.S. Cl. .......................... 156/345.26; 156/345.31; 156/345.32; 118/719
(58) Field of Search ....................... 156/345.24, 345.29, 156/345.31, 345.32; 118/715, 719; 414/939

(56) References Cited

U.S. PATENT DOCUMENTS

| | | | | |
|---|---|---|---|---|
| 4,699,570 A | * | 10/1987 | Bohn ........................... | 417/6 |
| 4,728,869 A | * | 3/1988 | Johnson et al. ............. | 388/811 |
| 5,626,679 A | | 5/1997 | Shimizu et al. | |
| 5,795,328 A | | 8/1998 | Barnitz et al. | |
| 5,944,049 A | * | 8/1999 | Beyer et al. ............. | 137/487.5 |
| 6,041,817 A | * | 3/2000 | Guertin .................. | 137/565.23 |
| 6,066,358 A | | 5/2000 | Guo et al. | |
| 6,316,045 B1 | * | 11/2001 | Bernard et al. ................. | 427/8 |
| 6,402,479 B1 | * | 6/2002 | Lagedamont et al. ....... | 417/201 |
| 6,419,455 B1 | * | 7/2002 | Rousseau et al. ............. | 417/36 |
| 2002/0020344 A1 | * | 2/2002 | Takano ........................ | 118/100 |
| 2002/0153102 A1 | * | 10/2002 | Bernard et al. ........ | 156/345.29 |

FOREIGN PATENT DOCUMENTS

| | | |
|---|---|---|
| EP | 0 843 339 A2 | 5/1998 |
| WO | WO 85/02888 | 7/1985 |

* cited by examiner

*Primary Examiner*—Gregory Mills
*Assistant Examiner*—Karla Moore
(74) *Attorney, Agent, or Firm*—Dugan & Dugan (57) ABSTRACT

In a first aspect, a system includes (1) a chamber; (2) a variable speed vacuum pump coupled to the chamber; and (3) a pressure controller coupled to the chamber. The pressure controller compares a set point pressure with a pressure measurement for the chamber and adjusts a flow of gas through the pressure controller based on a difference between the pressure measurement and the set point pressure. The system includes a pressure measurement device coupled to the chamber and to the pressure controller, and a main controller coupled to the variable speed vacuum pump, the pressure controller and the pressure measurement device. The pressure measurement device measures a pressure within the chamber and provides a pressure measurement to the pressure controller and the main controller. The main controller (1) adjusts a speed of the variable speed vacuum pump; and (2) provides the set point pressure to the pressure controller.

31 Claims, 4 Drawing Sheets

METHODS AND APPARATUS FOR MAINTAINING A PRESSURE WITHIN AN ENVIRONMENTALLY CONTROLLED CHAMBER

This patent application claims priority from U.S. Provisional Patent Application Ser. No. 60/211,402, filed Jun. 14, 2000, which is hereby incorporated by reference herein in its entirety.

FIELD OF THE INVENTION

The present invention relates to vacuum technology and more particularly to methods and apparatus for maintaining a pressure within an environmentally controlled chamber such as a vacuum chamber.

BACKGROUND OF THE INVENTION

Figure 1:
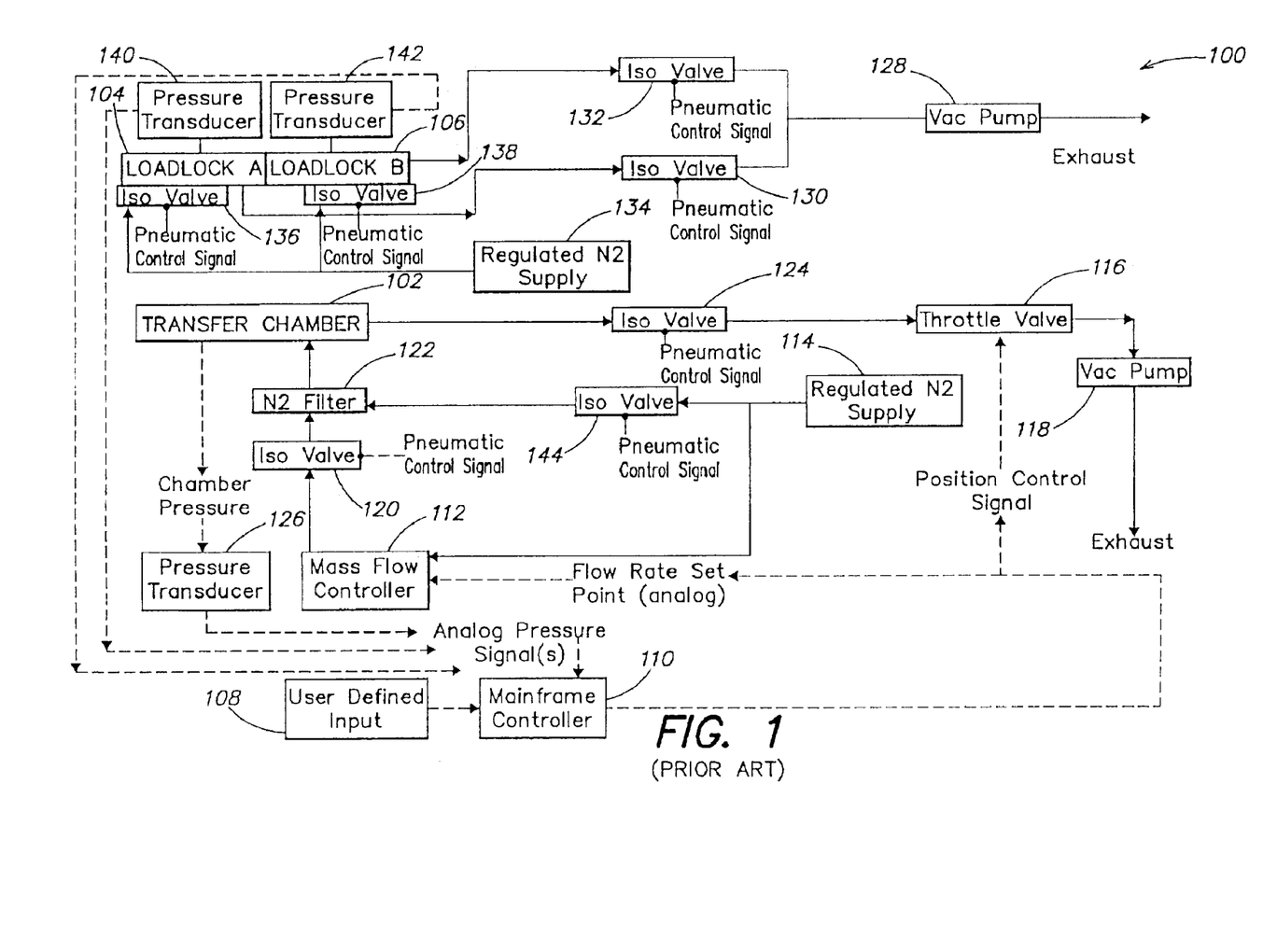
FIG. 1 is a block diagram of a conventional system for maintaining a pressure within a transfer chamber of a semiconductor device manufacturing tool.

FIG. 1 is a block diagram of a conventional system 100 for maintaining a pressure within a transfer chamber 102 of a semiconductor device manufacturing tool (e.g., the Endura™ (shown in FIG. 4) or the Centura™, both manufactured by Applied Materials, Inc.). The transfer chamber 102 is shown coupled to a first load lock 104 and to a second load lock 106. The load locks 104, 106 are adapted to transfer semiconductor wafers to and/or from the transfer chamber 102 as is well known in the art.

With reference to FIG. 1, to employ the conventional system 100 to maintain a pressure within the transfer chamber 102, a user (not shown) supplies a user defined input 108 to a mainframe controller 110 of the conventional system 100 (e.g., a conventional fabrication controller such as a manufacturing execution system (MES)). The user defined input 108 represents a pressure at which the transfer chamber 102 is to operate (e.g., a set point pressure for the transfer chamber 102).

To maintain the set point pressure within the transfer chamber 102, the conventional system 100 employs a mass flow controller 112 to adjust a flow rate of nitrogen (or some other inert, non-reactive gas supplied from a regulated gas supply 114) into the transfer chamber 102 and employs a throttle valve 116 to adjust a rate at which the nitrogen (and any other impurities such as oxygen that are out-gassed from the chamber walls) is pumped from the transfer chamber 102 (via a vacuum pump 118). Accordingly, after receiving the user defined input 108, the mainframe controller 110 employs an algorithm to (1) calculate a flow rate of nitrogen into the transfer chamber 102 (e.g., by calculating a flow rate set point for the mass flow controller 112); and (2) calculate a pump rate of nitrogen (and any other gases) from the transfer chamber 102 (e.g., by calculating a throttle valve position control signal for the throttle valve 116). The flow rate set point and the throttle valve position control signal are provided from the mainframe controller 110 to the mass flow controller 112 and to the throttle valve 116, respectively, as shown in FIG. 1.

The mainframe controller 110 provides a pneumatic control signal to a first isolation valve 120 so as to open the first isolation valve 120 and allow nitrogen to flow from the regulated gas supply 114 through the mass flow controller 112 and into the transfer chamber 102 via a nitrogen filter 122 (e.g., a Millipore distributed by U.S. Filter, Inc.); and the mainframe controller 110 provides a pneumatic control signal to a second isolation valve 124 so as to open the second isolation valve 124 and allow the vacuum pump 118 to pump the transfer chamber 102.

After establishing the flow rate of the mass flow controller 112 and the position of the throttle valve 116, the mainframe controller 110 employs a first pressure transducer 126 (e.g., an MKS Instruments' capacitive manometer, a Baratron capacitive manometer, a Granville Philips' convection capacitive manometer, a Granville Philips' convection gauge, etc.) coupled to the transfer chamber 102 to monitor the pressure within the transfer chamber 102 (e.g., by periodically sampling the output signal of the first pressure transducer 126). Based on each sampled output signal of the first pressure transducer 126, the mainframe controller 110 recalculates a flow rate set point for the mass flow controller 112 and a throttle valve position control signal for the throttle valve 116 (to adjust the flow rate of nitrogen into the transfer chamber 102 and/or the pump rate of gas from transfer chamber 102) so as to achieve the pressure originally defined by the user defined input 108. Note that some conventional throttle valves may include a local controller for monitoring chamber pressure and adjusting throttle valve position based thereon.

When pressure variations result in the transfer chamber 102 (e.g., due to the opening of the first load lock 104 when a wafer is transferred into the transfer chamber 102 from the first load lock 104, the opening of the second load lock 106 when a wafer is transferred out of the transfer chamber 102 to the second load lock 106, and/or when a processing chamber (not shown) coupled to the transfer chamber 102 is opened to transfer a wafer to or from the processing chamber), the mainframe controller 110 detects the pressure change via the first pressure transducer 126 and accordingly adjusts one or both of the flow rate of the mass flow controller 112 and the position of the throttle valve 116. The conventional system 100 thus employs a feedback control loop comprising the first pressure transducer 126, the mainframe controller 110, the mass flow controller 112 and the throttle valve 116 to maintain the desired pressure within the transfer chamber 102.

To control the pressure in the first load lock 104 and the second load lock 106, the conventional system 100 employs a separate vacuum pump 128 coupled to the first load lock 104 via a second isolation valve 130 and coupled to the second load lock 106 via a third isolation valve 132. Both isolation valves 130, 132 are controlled by pneumatic control signals from the mainframe controller 110 and may be individually opened/closed to selectively evacuate each load lock. Similarly, a regulated nitrogen flow may be provided to each load lock 104, 106 via a regulated nitrogen supply 134 coupled to both the first load lock 104 and the second load lock 106 via an isolation valve 136 and an isolation valve 138, respectively. The pressure within the first load lock 104 is measured by the mainframe controller 110 via a second pressure transducer 140 and the pressure within the second load lock 106 is measured by the mainframe controller 110 via a third pressure transducer 142. Note that an isolation valve 144 that is controllable by the mainframe controller 110 also is provided between the regulated gas supply 114 and the filter 122 (e.g., so as to allow the mass flow controller 112 to be bypassed if desired).

The conventional system 100 of FIG. 1 suffers from a number of drawbacks. For example, the mainframe controller 110's empirical calculation of both a flow rate for the mass flow controller 112 and a throttle valve position for the throttle valve 116 based on a measured pressure within the transfer chamber 102 is a complex calculation that (1) is not highly accurate (e.g., as the method by which a mass flow controller measures mass flow is prone to error unless repetitive calibration is used); and (2) may be time consuming to implement because the mainframe controller 110 may need to control numerous other functions (e.g., the operation of the first load lock 104, of the second load lock 106, of various processes and processing chambers (not shown) coupled to the transfer chamber 102, etc.) and because of the slow response time of the throttle valve 116. Accordingly, the pressure within the transfer chamber 102 is not highly regulated (e.g., may fluctuate to an unacceptable level for a given period of time). Additionally, the conventional system 100 is expensive because of the use of a throttle valve (e.g., the throttle valve 116) and a mass flow controller (e.g., the mass flow controller 112), and because of the use of a separate pump (e.g., the vacuum pump 128) to control the pressure within first load lock 104 and the second load lock 106.

Accordingly, a need exists for improved methods and apparatus for maintaining a pressure within a vacuum chamber such as a transfer chamber of a semiconductor device manufacturing tool.

SUMMARY OF THE INVENTION

In accordance with a first aspect of the invention, a system is provided for maintaining a pressure within a chamber such as a transfer chamber, a processing chamber or the like. The system includes (1) a chamber; (2) a variable speed vacuum pump coupled to the chamber; and (3) a pressure controller coupled to the chamber. The pressure controller is adapted to compare a set point pressure with a pressure measurement for the chamber and to adjust a flow of gas through the pressure controller based on a difference between the pressure measurement and the set point pressure.

The system also includes a pressure measurement device coupled to the chamber and to the pressure controller, and a main controller coupled to the variable speed vacuum pump, the pressure controller and the pressure measurement device. The pressure measurement device is adapted to measure a pressure within the chamber and to provide a pressure measurement to the pressure controller and/or to the main controller. The main controller is adapted to (1) adjust a speed of the variable speed vacuum pump; and (2) provide the set point pressure to the pressure controller.

In a second aspect of the invention, the chamber is a transfer chamber and the system includes a load lock and/or a processing chamber coupled to the transfer chamber. A single pump may pump both the transfer chamber and the load lock. Numerous other aspects are provided.

Other features and advantages of the present invention will become more fully apparent from the following detailed description, the appended claims and the accompanying drawings.

DETAILED DESCRIPTION

Figure 2:
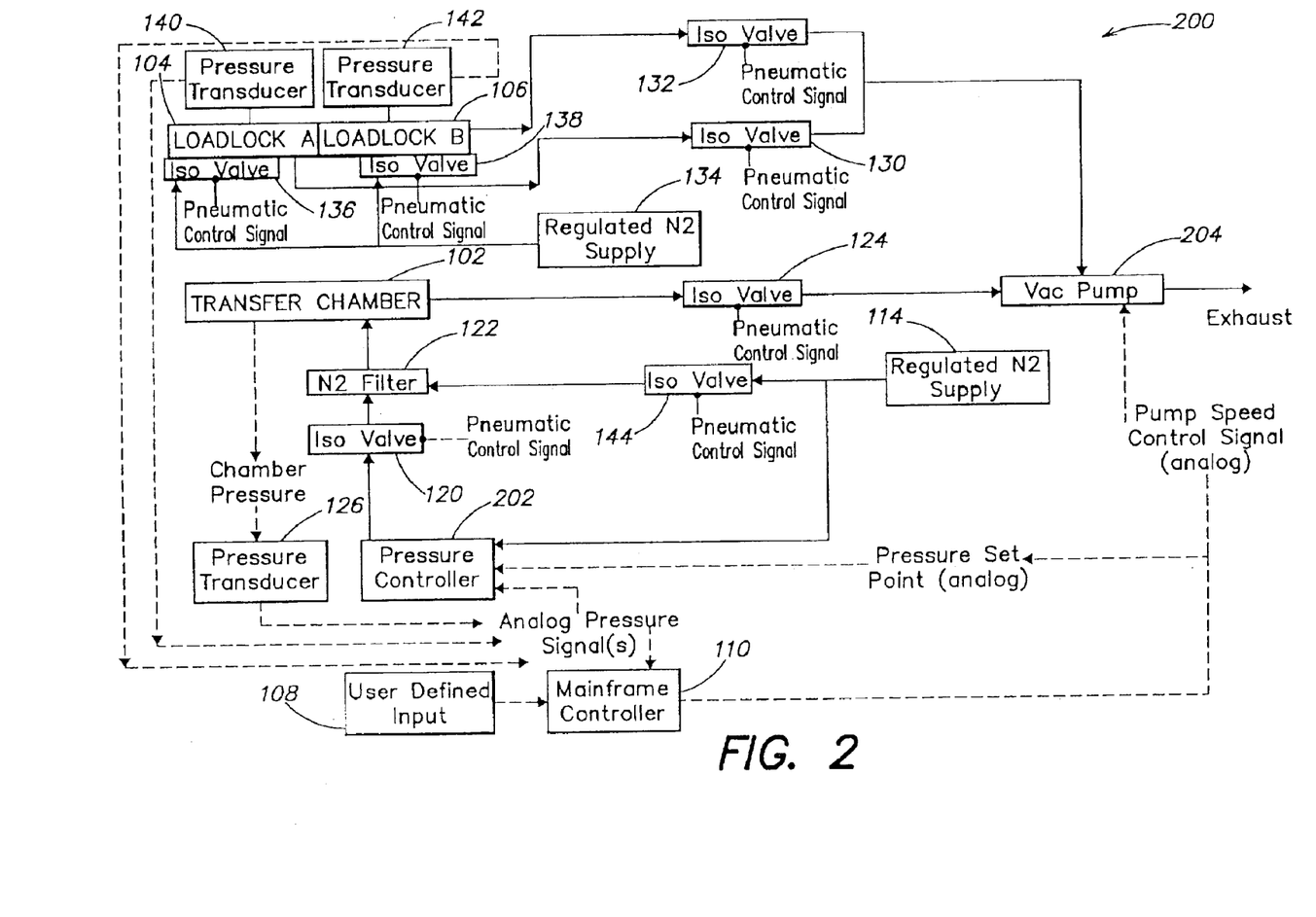
FIG. 2 is a block diagram of an exemplary inventive system for maintaining a pressure within a transfer chamber of a semiconductor device manufacturing tool.

To address the needs of the prior art an inventive system is provided for maintaining a pressure within a vacuum chamber (such as a transfer chamber, a processing chamber or the like). Specifically, FIG. 2 is a block diagram of an exemplary inventive system 200 for maintaining a pressure within a transfer chamber of a semiconductor device manufacturing tool (e.g., the Endura™ (shown in FIG. 4) or the Centura™ (not shown), both manufactured by Applied Materials, Inc.). While the present invention is described below with reference to a transfer chamber of a semiconductor device manufacturing tool, it will be understood that the invention may be employed with any environmentally controlled chamber, whether the chamber is operated above, at or below atmospheric pressure.

For convenience, only the differences between the conventional system 100 of FIG. 1 and the inventive system 200 of FIG. 2 are described herein, and like reference numbers are employed for components that perform similar functions. With reference to FIG. 2, the main differences between the conventional system 100 and the inventive system 200 are:

1. the mass flow controller 112 is replaced with a pressure controller 202 and the output signal of the first pressure transducer 126 is fed to both the pressure controller 202 and the mainframe controller 110;
2. the throttle valve 116 is not employed;
3. the vacuum pump 118 is replaced with a variable speed vacuum pump 204 that has a speed that may be controlled by the mainframe controller 110 (via a pump speed control signal); and
4. the vacuum pump 128 is not employed (e.g., the variable speed vacuum pump 204 is employed to pump the first load lock 104, the second load lock 106 and the transfer chamber 102).

The pressure controller 202 may comprise, for example, a volumetric flow controller having a proportional integral derivative (PID) closed-loop control unit (e.g., an MKS Instruments Model No. MKS-640 pressure controller) that compares the output signal from the pressure transducer 126 to a set point pressure established by the mainframe controller 110 and that adjusts the volumetric flow rate of nitrogen into the transfer chamber 102 so as to maintain the set point pressure (as described below). Other suitable pressure controllers may include, for example, pressure controllers that employ neural networks, fuzzy logic, etc., for feedback control. Alternatively, the pressure controller 202 may comprise a flow controller such as a proportional valve that lacks feedback control, and the main controller 110 may adjust flow rate through the pressure controller 202 based on pressure measurements from the pressure transducer 126. In either case, a particular advantage of employing a pressure controller rather than a mass flow controller is that unlike mass flow control, pressure control is independent of gas type.

The variable speed vacuum pump 204 may comprise any conventional pump (e.g., a mechanical pump) having a pump speed that may be varied (e.g., so as to allow a suction flow rate of the pump to be varied in accordance with variations in a motor speed of the pump). Conventional pumps that may modified (e.g., by varying the voltage that drives the pump motor based on the signal from the mainframe controller 110) so as to have variable speed pump rates are well known in the art and include, for example, various mechanical pumps manufactured by Edwards, Alcatel, Ebara and the like.

With reference to FIG. 2, to employ the inventive system 200 to maintain a pressure within the transfer chamber 102, a user (not shown) supplies the user defined input 108 to a mainframe controller 110 of the inventive system 200. The user defined input 108 represents a pressure at which the transfer chamber 102 is to operate (e.g., a set point pressure for the transfer chamber 102). To maintain the set point pressure within the transfer chamber 102, the inventive system 200 employs the pressure controller 202 to adjust a volumetric flow rate of nitrogen (or some other inert, non-reactive gas supplied from a regulated gas supply 114) into the transfer chamber 102 and employs the variable speed vacuum pump 204 to adjust a rate at which the nitrogen that flows into the transfer chamber 102 is pumped from the transfer chamber 102. Other gases such as degassed oxygen also may be pumped from the transfer chamber 102.

In general, the pump rate of the variable speed vacuum pump 204 serves as a gross pressure adjustment and is employed only when large pressure variations are detected or expected within the transfer chamber 102 (e.g., when a wafer is being transferred to or from the transfer chamber 102, into or from one of the first load lock 104, the second load lock 106 or a processing chamber (not shown)). Accordingly, after receiving the user defined input 108, the mainframe controller 110 converts the user defined input 108 (typically a digital signal) into an analog set point pressure and supplies the analog set point pressure to the pressure controller 202. The pressure controller 202 then employs a closed loop feedback control technique (e.g., a P, a PI or a PID control loop) to calculate a flow rate of nitrogen into the transfer chamber 102 that will establish the set point pressure.

The mainframe controller 110 also generates a pump speed control signal based on the set point pressure, and supplies the pump speed control signal to the variable speed vacuum pump 204 so as to set the variable speed vacuum pump 204's pump speed to a rate that will maintain the pressure within the transfer chamber 102 at a level that provides the pressure controller 202 maximum pressure range control. For example, if the pressure controller 202 has a flow rate range of 1 milliliter/minute to 1 liter/minute, the pump speed of the variable speed vacuum pump 204 may be set at a speed (e.g., an empirically determined speed) that allows the pressure controller 202 to control the maximum pressure variation within the transfer chamber 102 when the pressure controller 202 adjusts the flow rate of nitrogen from 1 milliliter/minute to 1 liter/minute. Note that the mainframe controller 110 also provides a pneumatic control signal to the first isolation valve 120 so as to open the first isolation valve 120 and allow nitrogen to flow from the regulated gas supply 114 through the pressure controller 202 and into the transfer chamber 102 via the nitrogen filter 122. The mainframe controller 110 further provides a pneumatic control signal to the second isolation valve 124 so as to open the second isolation valve 124 and allow the vacuum pump 204 to pump the transfer chamber 102.

After the pressure controller 202 establishes the flow rate within the pressure controller 202 and the mainframe controller 110 establishes the pump rate of the variable speed vacuum pump 204, both the mainframe controller 110 and the pressure controller 202 employ the first pressure transducer 126 coupled to the transfer chamber 102 to monitor the pressure within the transfer chamber 102 (e.g., by periodically sampling the output signal of the first pressure transducer 126). Based on each sampled output signal of the first pressure transducer 126, the pressure controller 202 recalculates a flow rate of nitrogen to be flowed into the transfer chamber 102 so as to achieve the set point pressure. The mainframe controller 110 only adjusts the pump rate of the variable speed vacuum pump 204 if the pressure within the transfer chamber 102 cannot be sufficiently controlled via the pressure controller 202 (e.g., if a large positive pressure variation results so that the flow rate adjustment range of the pressure controller 202 is inadequate to efficiently reestablish the set point pressure).

When pressure variations result in the transfer chamber 102 (e.g., due to the opening of the first load lock 104 when a wafer is transferred into the transfer chamber 102 from the first load lock 104, the opening of the second load lock 106 when a wafer is transferred out of the transfer chamber 102 to the second load lock 106, and/or when a processing chamber (not shown) coupled to the transfer chamber 102 is opened to transfer a wafer to or from the processing chamber), the mainframe controller 110 and the pressure controller 202, via the first pressure transducer 126, detect the pressure change, and the pressure controller 202 adjusts the volumetric flow rate into the transfer chamber 102 accordingly. As stated, the mainframe controller 110 may choose to adjust the pump rate of the variable speed vacuum pump 204 to aid in rapid re-establishment of the set point pressure within the transfer chamber 102. However, in general, the pump rate of the variable speed vacuum pump 204 may be held approximately constant.

The inventive system 200 thus employs a feedback control loop comprising the first pressure transducer 126, the mainframe controller 110, the pressure controller 202 and the variable speed vacuum pump 204 to maintain the desired pressure within the transfer chamber 102. Because of the rapid response of the pressure controller 202 relative to the mainframe controller 110 and to the throttle valve 116 (FIG. 1), the inventive system 200 may achieve a desired pressure within the transfer chamber 102 much more rapidly, and may maintain the desired pressure within the transfer chamber 102 to a much tighter tolerance, than the conventional system 100 of FIG. 1.

Figure 3:
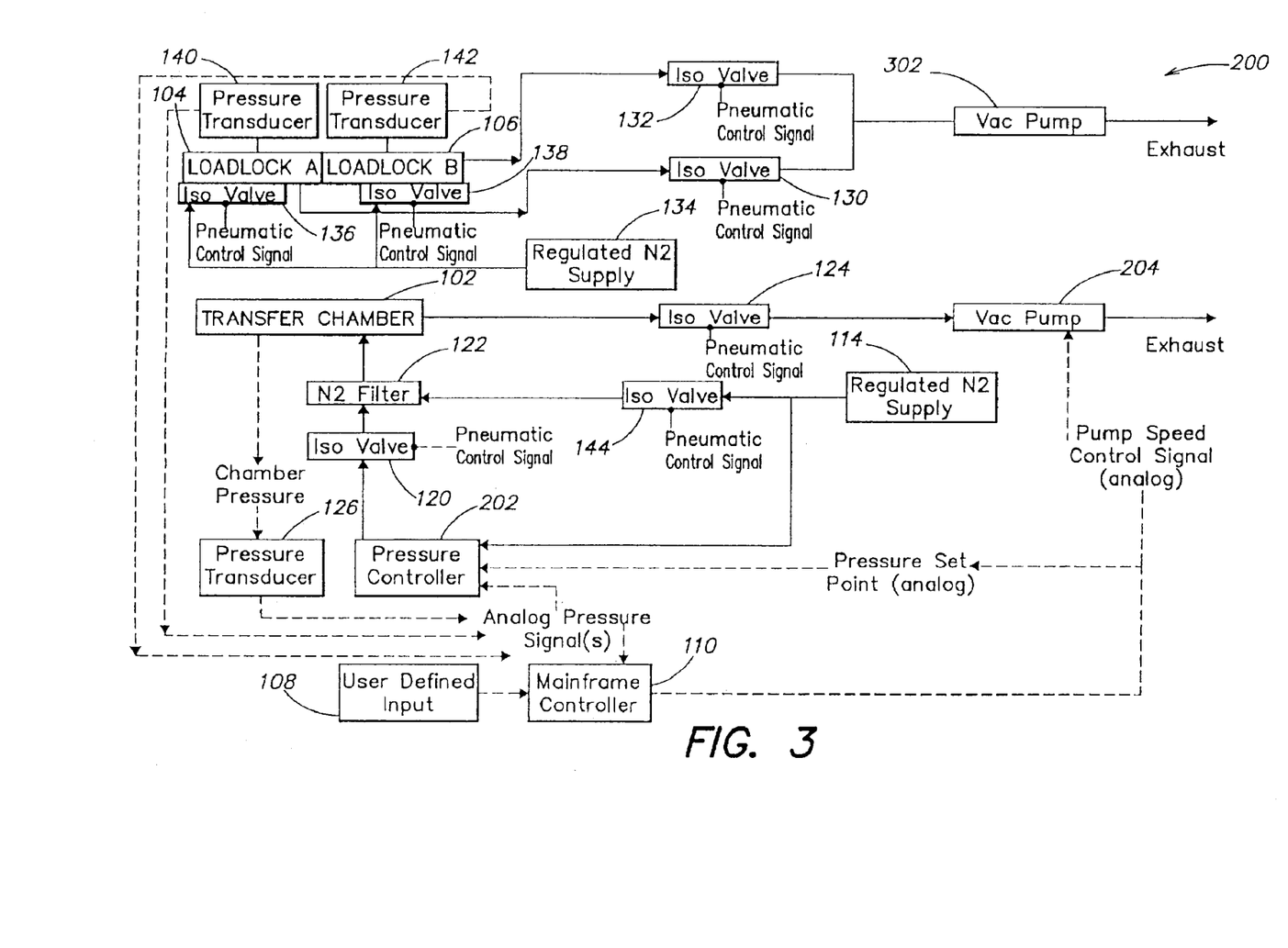
FIG. 3 is a block diagram an alternative inventive system for maintaining a pressure within a transfer chamber of a semiconductor device manufacturing tool.

To control the pressure in the first load lock 104 and the second load lock 106, the inventive system 200 employs the same pump (e.g., the variable speed vacuum pump 204) that is used to pump the transfer chamber 102. Accordingly, because the inventive system 200 employs only a single pump and no throttle valve, the inventive system 200 is significantly less expensive than the conventional system 100 of FIG. 1. If desired, a separate pump 302 (e.g., a non-variable speed pump) also may be employed with the inventive system 200 as shown in FIG. 3.

In order to not adversely affect the wafer throughput of the system 200 due to the use of a single pump (FIG. 2), software within the mainframe controller 110 may be configured to pump the first load lock 104, the second load lock 106 and the transfer chamber 102 in a sequence. For example, when the system 200 of FIG. 2 is first employed, the pump 204 may be used to pump the transfer chamber 102 to a base pressure, and the isolation valve 124 then may be closed. Assuming the transfer chamber 102 is primarily leak tight, the pressure within the transfer chamber 102 should not rise significantly and there should be no flow of gas into the chamber 102 from the pressure controller 202. The pump 204 thereafter may be employed to evacuate one or both of the load locks 104, 106 as required for substrate transfer. Likewise, the transfer chamber 102 may be pumped down to a base pressure after one or both of the load locks 104, 106 have been evacuated.

In at least one embodiment, the vacuum pump 204 is an integrated point of use pump (IPUP) (e.g., a pump that is sufficiently small to allow the pump to be placed on a semiconductor device manufacturing tool so that the distance between the vacuum pump 204 and the isolation valve 124 is only about a foot as opposed to up to 100 yards when a conventional pump is employed). The use of an IPUP speeds up the response time on the suction flow rate side of the system 200 (e.g., the vacuum pump side of the system 200) so that an adjustment to the pump speed of the vacuum pump 204 makes a rapid adjustment in suction flow rate. An IPUP also is less expensive than larger pumps, as is the cost of installing an IPUP (e.g., as only a short distance of plumbing is required). An example of an IPUP is the Alcatel ADP100L IPUP.

Figure 4:
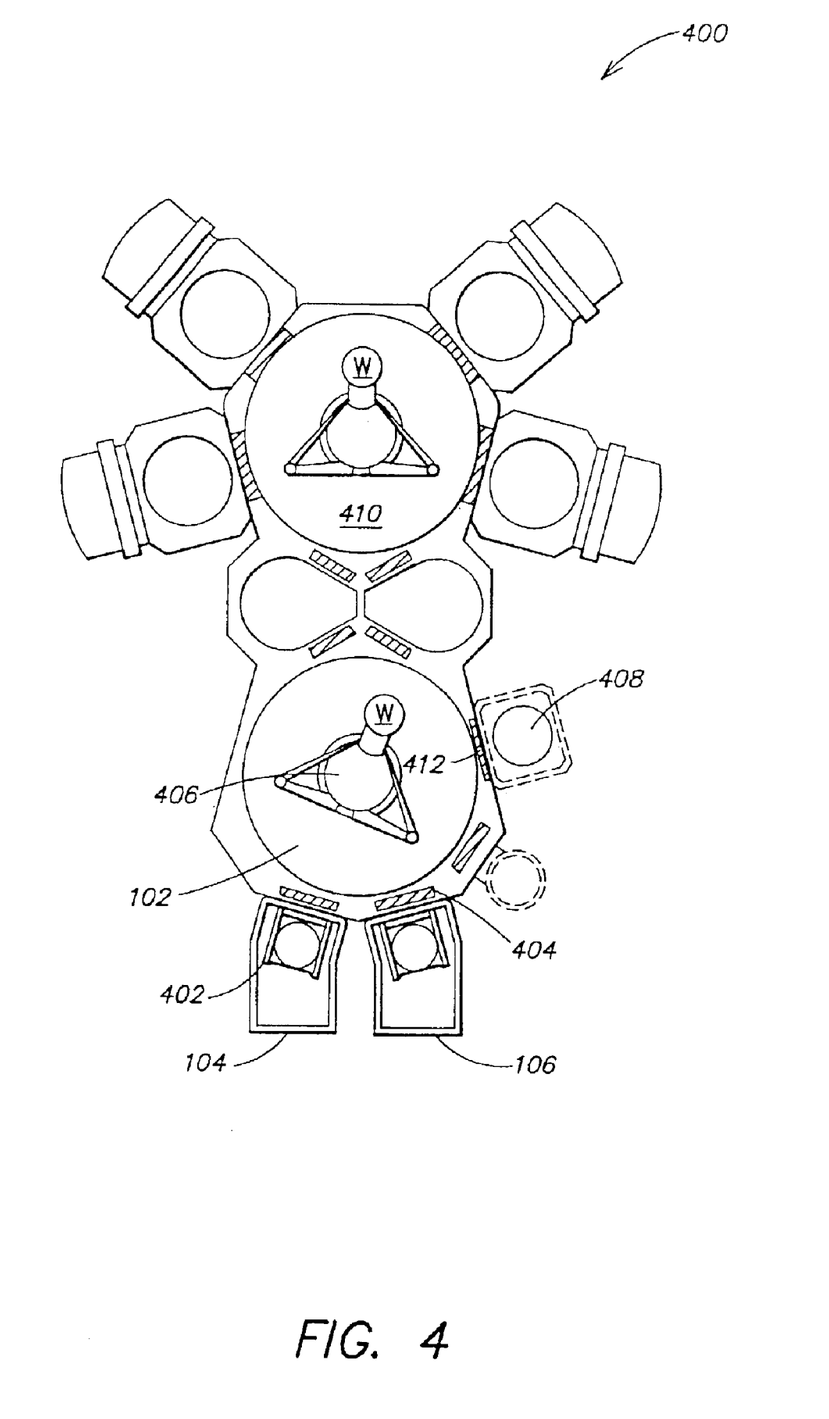
FIG. 4 is a top plan view of a semiconductor device manufacturing tool configured in accordance with the present invention.

FIG. 4 is a top plan view of a semiconductor device manufacturing tool 400 useful in describing the operation of the invention system 200 with a single pump such as an IPUP. Other tools or vacuum chambers may be similarly controlled.

With reference to FIGS. 2 and 4, in an exemplary operation, when a single pump is employed, the transfer chamber 102 may be connected to a shared IPUP 204 (FIG. 2) and a pressure controller 202 which is sized/configured for the correct operating pressure. The IPUP 204 may service the transfer chamber 102 and the load locks 104, 106. The base pressure for the transfer chamber 102 is set via the mainframe controller 110 (in response to a user-defined input 108) and the transfer chamber isolation valve 124 is opened. Once the transfer chamber base pressure is reached, the transfer chamber isolation valve 124 is closed.

When a substrate is to be processed within the tool 400, a substrate carrier 402 is loaded into one of the load locks 104, 106 (load lock 104 in FIG. 4). The load lock 104 then is exposed to the shared IPUP 204 (by opening isolation valve 136) and is pumped down as required for substrate transfer (e.g., to the base pressure of the transfer chamber 102). Both load locks 104, 106 may be pumped simultaneously if desired.

Once the load lock 104 reaches the appropriate pressure, a slit valve 404 disposed between the transfer chamber 102 and the load lock 104 opens, and a substrate handler 406 located within the transfer chamber 102 extracts a substrate from the substrate carrier 402. The substrate handler 406 retracts, and the slit valve 404 then may close. The pressure controller 202 responds to pressure fluctuations as required to maintain the transfer chamber base pressure.

Once the substrate is located within the transfer chamber 102, the substrate may be similarly transferred to a processing chamber (such as a processing chamber 408) or to a second transfer chamber 410. For example purposes only, it is assumed that the substrate is to be transferred to the processing chamber 408. Because the pressure within the transfer chamber 102 rises very slowly (e.g., assuming the transfer chamber 102 is primarily leak tight and/or does not outgas significantly), it is expected that the maximum allowable transfer chamber pressure will not be reached prior to the opening of a processing chamber slit valve 412 that separates the transfer chamber 102 and the processing chamber 408. Accordingly, the pump 204 may be employed for other purposes (e.g., pumping load locks).

To transfer the substrate to the processing chamber 408, the processing chamber slit valve 412 is opened. In response thereto, the pressure within the transfer chamber 102 decreases (due to pumping by a vacuum pump (not shown) coupled to the processing chamber 408). The pressure controller 202 responds to this increased pumping speed/rate by flowing more nitrogen into the transfer chamber 102. A pressure gradient thereby is generated from the transfer chamber 102 to the processing chamber 408 (e.g., allowing for processing gas abatement). The pressure gradient will be maintained as long as the maximum $N_2$ flow is not reached.

Note that in either a single pump configuration (FIG. 2) or a dual pump configuration (FIG. 3), the pump connected to the transfer chamber 102 typically is isolated from the transfer chamber 102 before the processing chamber slit valve 412 is opened so that the processing chamber 408 is the only vacuum source (e.g., thereby maintaining the desired pressure gradient).

With the slit valve 412 open, the substrate handler 406 transfers the substrate from the transfer chamber 102 to the processing chamber 408 and retracts, and the processing chamber slit valve 412 closes. Once the processing chamber slit valve 412 is closed, the pressure controller 202 reduces (and/or shuts off) the $N_2$ flow into the transfer chamber 102 (after the transfer chamber base pressure is reached). When the system is off-line or idle, the transfer chamber isolation valve 124 and the loadlock isolation valves 136, 138 may remain open. The pressure controller 202 may continue to respond to pressure fluctuations to maintain the transfer chamber 102 and the load locks 104, 106 at a desired off-line base pressure (if the slits valves between the transfer chamber 102 and the load locks 104, 106 are open).

Note that the pressure inside a transfer chamber may be an important parameter during substrate transfers. For example, it may be desirable to maintain a pressure gradient between a processing chamber and the transfer chamber to induce a flow into the processing chamber when a slit valve of the processing chamber opens. This flow can serve as an inert gas purge for corrosion or explosion abatement. The flow can also reduce the amount of particles in the transfer chamber by flowing the particles into a less clean processing chamber and into a pump of the processing chamber. However, too large of a pressure differential between a processing chamber and the transfer chamber 102 may produce a large initial burst of gas into the processing chamber that stirs up contaminants within the processing chamber. One technique for avoiding such a gas burst is to limit the gain of the pressure controller 204. The correct transfer chamber pressure can also improve the conductive and convective heat transfer from a hot substrate during substrate transfers.

An exemplary operating regime for pressure control within the transfer chamber 102 ranges from less than 1 T to near 100 T (where T=Torr). In such a range, there may be three pressure regimes: low, medium, and high pressure; and pressure changes due to the vacuum pump 204 and the nitrogen flow (from the pressure controller 202) may be different within each pressure regime. For example, in the low pressure regime, below 1 T, the system 200 may run in a pump-limited mode where the response is slow if a negative pressure change is required. However, the pressure controller 202 may respond more quickly to a positive pressure change, such as from 100 mT to 1 T. Between 1 T and 10 T, or in the medium pressure regime, a higher $N_2$ flow may have less of an influence on pressure because the vacuum pump 204 may be more efficient. Above 20 T, or in the high pressure regime, the vacuum pump 204 may be very efficient and have a large affect on pressure changes.

When designing a low pressure system, variables that may be taken into account include, for example, the internal volume of the transfer chamber 102, the number of purge points, the nitrogen restrictions due to filters (e.g., the filter 122) or other components, the nitrogen supply pressure, the range and position of the pressure transducer 126, line size, and the size of the pressure controller 202's flow body. Other variables include pump speed, PID gain, and the like. Exemplary components include a 10 T Baratron pressure transducer 126 and a 1 slm pressure controller 202 with a proportional gain set to 4 and an integral gain set to 0. The vacuum pump 204 (e.g., an Alcatel ADP100L IPUP) may be run at its full speed, and a nitrogen pressure of 35 psi may be employed When designing a high pressure system, a higher flow pressure controller 202 may be used in conjunction with pump speed control. One advantage of pump speed control is that a system with a slower pump speed may waste less nitrogen. In addition, the response time of the pressure controller 202 may be faster with a slower pump speed. The pump speed and the pressure controller P and I (for an MKS 640 pressure controller) may be set, for example, so that the pump speed is 30% of maximum, the P term is 3, and the I term is 1.

The foregoing description discloses only exemplary embodiments of the invention. Modifications of the above disclosed apparatus and method which fall within the scope of the invention will be readily apparent to those of ordinary skill in the art. For instance, other pressure ranges than those described above may be employed. The particular pressure controllers, pumps and other components described herein are merely exemplary. Other similar and/or suitable components may be employed. For example, a pressure measurement device such as an ion gauge, a residual gas analyzer or the like may be used in place of the pressure transducer 126. While the present invention has been described primarily with reference to semiconductor device manufacturing, it will be understood that the invention may be applied to chambers used to process other types of substrates (e.g., glass substrates employed in flat panel displays), whether or not the chambers are operated above, at or below atmospheric pressure.

The mainframe controller 110 and/or any other controller may contain computer program code for performing any of the control functions described herein, and may include one or more inventive computer program products and/or data structures. Each computer program product may be carried by a medium readable by a computer (e.g., a carrier wave signal, a floppy disc, a compact disc, a DVD, a hard drive, a random access memory, etc.).

Accordingly, while the present invention has been disclosed in connection with exemplary embodiments thereof, it should be understood that other embodiments may fall within the spirit and scope of the invention, as defined by the following claims.

The invention claimed is:

1. A system adapted to maintain a pressure within a chamber comprising:
   a chamber;
   a variable speed vacuum pump coupled to the chamber;
   a pressure controller coupled to the chamber and adapted to compare a set point pressure with a pressure measurement for the chamber and to adjust a flow of gas through the pressure controller based on a difference between the pressure measurement and the set point pressure;
   a pressure measurement device coupled to the chamber and to the pressure controller, the pressure measurement device adapted to measure a pressure within the chamber and to provide a pressure measurement to the pressure controller; and
   a main controller coupled to the variable speed vacuum pump, the pressure controller and the pressure measurement device, the main controller adapted to:
   adjust a speed of the variable speed vacuum pump;
   provide the set point pressure to the pressure controller; and
   adjust a flow of gas through the pressure controller based on the pressure measurement.

2. The system of claim 1 wherein the chamber comprises a vacuum chamber of a semiconductor device manufacturing tool.

3. The system of claim 2 wherein the vacuum chamber comprises a transfer chamber.

4. The system of claim 2 wherein the vacuum chamber comprises a processing chamber.

5. The system of claim 1 wherein the variable speed vacuum pump is an integrated point of use pump.

6. The system of claim 1 wherein the pressure controller is a volumetric flow controller.

7. The system of claim 6 wherein the pressure controller includes proportional integral derivative closed-loop control.

8. The system of claim 1 wherein the chamber comprises a transfer chamber and wherein the system further comprises a load lock coupled to the transfer chamber.

9. The system of claim 8 further comprising an additional pump coupled to the load lock and to the main controller, the additional pump adapted to pump the load lock to a pressure that is at least equal to a pressure of the chamber.

10. The system of claim 8 wherein the load lock is coupled to the variable speed vacuum pump.

11. The system of claim 8 further comprising a processing chamber coupled to the transfer chamber.

12. The system of claim 1 wherein the main controller is adapted to:
   determine a pressure at which the chamber is to be maintained; and
   maintain the pressure within the chamber by employing the pressure controller to control a flow rate of gas into the chamber and by employing the variable speed vacuum pump to control a flow rate of gas from the chamber.

13. A system adapted to maintain a pressure within a transfer chamber comprising:
   a transfer chamber;
   a load lock coupled to the transfer chamber;
   a processing chamber coupled to the transfer chamber;
   a variable speed vacuum pump coupled to the transfer chamber and to the load lock;
   a pressure controller coupled to the transfer chamber and adapted to compare a set point pressure with a pressure measurement for the transfer chamber and to adjust a flow of gas through the pressure controller based on a difference between the pressure measurement and the set point pressure;
   a pressure measurement device coupled to the transfer chamber and to the pressure controller, the pressure measurement device adapted to measure a pressure within the transfer chamber and to provide a pressure measurement to the pressure controller; and
   a main controller coupled to the variable speed vacuum pump, the pressure controller and the pressure measurement device, the main controller adapted to:
   adjust a speed of the variable speed vacuum pump; and
   provide the set point pressure to the pressure controller.

14. A method of maintaining a base pressure within a chamber comprising:
   determining a base pressure at which a chamber is to be maintained; and
   maintaining the base pressure within the chamber by employing a pressure controller to control a flow rate of gas into the chamber and by employing speed of a variable speed vacuum pump to control a flow rate of gas from the chamber.

15. The method of claim 14 wherein determining a base pressure comprises receiving a base pressure at which the chamber is to operate.

16. The method of claim 14 wherein maintaining the base pressure within the chamber comprises:
   determining a set point pressure for the pressure controller based on the base pressure;
   supplying the set point pressure to the pressure controller; and
   setting a flow rate of gas into the chamber with the pressure controller based on the set point pressure.

17. The method of claim 16 wherein setting the flow rate comprises employing a closed-loop feedback technique to calculate the flow rate.

18. The method of claim 17 wherein the closed-loop feedback technique is selected from a group consisting of proportional, proportional-integral and proportional-integral-derivative closed-loop feedback techniques.

19. The method of claim 14 wherein maintaining the base pressure within the chamber comprises:
   determining a pump speed signal for the pump based on the base pressure;
   supplying the pump speed signal to the pump; and
   setting the pump speed for the pump based on the pump speed signal.

20. The method of claim 19 wherein setting the pump speed for the pump comprises setting a pump speed that provides a maximum pressure range for the pressure controller.

21. The method of claim 14 further comprising using the pump to control the pressure within a load lock coupled to the chamber.

22. The method of claim 14 further comprising measuring a pressure within the chamber.

23. The method of claim 22 further comprising recalculating a flow rate of gas into the chamber based on the measured pressure.

24. The method of claim 22 further comprising adjusting the pump speed of the pump based on the measured pressure only if adjusting the flow rate of gas into the chamber cannot maintain the base pressure.

25. A method of maintaining a pressure within a chamber comprising:
   determining a base pressure at which a chamber is to be maintained;
   determining a pump speed signal for a pump coupled to the chamber based on the base pressure;
   supplying the pump speed signal to the pump;
   setting the pump speed for the pump based on the pump speed signal;
   determining a set point pressure for a pressure controller coupled to the chamber based on the base pressure;
   supplying the set point pressure to the pressure controller;
   setting a flow rate of gas into the chamber with the pressure controller based on the set point pressure;
   measuring a pressure within the chamber;
   recalculating a flow rate of gas into the chamber based on the measured pressure; and
   adjusting the pump speed of the pump based on the measured pressure only if adjusting the flow rate of gas into the chamber cannot maintain the base pressure.

26. A system adapted to maintain a pressure within a chamber comprising:
   a chamber;
   a variable speed vacuum pump coupled to the chamber;
   a pressure controller coupled to the chamber and adapted to control a flow rate of gas into the chamber;
   a pressure measurement device coupled to the chamber and adapted to measure a pressure within the chamber; and
   a main controller coupled to the variable speed vacuum pump, the pressure controller and the pressure measurement device, the main controller adapted to:
      receive the pressure measurement from the pressure measurement device;
      adjust a speed of the variable speed vacuum pump based on the pressure measurement; and
      adjust a flow of gas through the pressure controller based on the pressure measurement.

27. The system of claim 1 wherein the main controller is adapted to adjust the speed of the variable speed vacuum pump based on the pressure measurement.

28. A system adapted to maintain a pressure within a chamber comprising:
   a chamber;
   a variable speed vacuum pump coupled to the chamber;
   a pressure controller coupled to the chamber and adapted to compare a set point pressure with a pressure measurement for the chamber and to adjust a flow of gas through the pressure controller based on a difference between the pressure measurement and the set point pressure;
   a pressure measurement device coupled to the chamber and to the pressure controller, the pressure measurement device adapted to measure a pressure within the chamber and to provide a pressure measurement to the pressure controller; and
   a main controller coupled to the variable speed vacuum pump, the pressure controller and the pressure measurement device, the main controller adapted to:
      adjust a speed of the variable speed vacuum pump; and
      provide the set point pressure to the pressure controller,
   wherein the pressure controller is a volumetric flow controller.

29. The system of claim 28 wherein the pressure controller includes proportional integral derivative closed-loop control.

30. A system adapted to maintain a pressure within a chamber comprising:
   a chamber;
   a variable speed vacuum pump coupled to the chamber;
   a pressure controller coupled to the chamber and adapted to compare a set point pressure with a pressure measurement for the chamber and to adjust a flow of gas through the pressure controller based on a difference between the pressure measurement and the set point pressure;
   a pressure measurement device coupled to the chamber and to the pressure controller, the pressure measurement device adapted to measure a pressure within the chamber and to provide a pressure measurement to the pressure controller; and
   a main controller coupled to the variable speed vacuum pump, the pressure controller and the pressure measurement device, the main controller adapted to:

adjust a speed of the variable speed vacuum pump; and
provide the set point pressure to the pressure controller, wherein the chamber comprises a transfer chamber and wherein the system further comprises a load lock coupled to the transfer chamber, and further wherein the load lock is coupled to the variable speed vacuum pump.

31. A system adapted to maintain a pressure within a chamber comprising:

a chamber;

a variable speed vacuum pump coupled to the chamber;

a pressure controller coupled to the chamber and adapted to compare a set point pressure with a pressure measurement for the chamber and to adjust a flow of gas through the pressure controller based on a difference between the pressure measurement and the set point pressure;

a pressure measurement device coupled to the chamber and to the pressure controller, the pressure measurement device adapted to measure a pressure within the chamber and to provide a pressure measurement to the pressure controller; and a main controller coupled to the variable speed vacuum pump, the pressure controller and the pressure measurement device, the main controller adapted to:
adjust a speed of the variable speed vacuum pump; and
provide the set point pressure to the pressure controller, wherein the main controller is adapted to:
determine a pressure at which the chamber is to be maintained; and
maintain the pressure within the chamber by employing the pressure controller to control a flow rate of gas into the chamber and by employing the variable speed vacuum pump to control a flow rate of gas from the chamber.

* * * * *